(12) United States Patent
Lantz

(10) Patent No.: US 7,522,029 B1
(45) Date of Patent: Apr. 21, 2009

(54) PHASE CHANGE ACTUATOR

(75) Inventor: Mark Alfred Lantz, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/179,302

(22) Filed: Jul. 24, 2008

(51) Int. Cl.
*H01H 37/46* (2006.01)
*F03G 7/06* (2006.01)

(52) U.S. Cl. ..................... 337/139; 337/393

(58) Field of Classification Search .......... 337/139, 337/298, 382, 393; 310/311, 330, 331, 332, 310/357, 367; 73/1.15, 504.15, 862.634, 73/862.639
See application file for complete search history.

(56) References Cited

U.S. PATENT DOCUMENTS

| | | | |
|---|---|---|---|
| 5,631,514 A * | 5/1997 | Garcia et al. | 310/309 |
| 5,825,275 A | 10/1998 | Wuttig et al. | |
| 7,066,004 B1 * | 6/2006 | Kohler et al. | 73/1.38 |
| 2002/0170290 A1 * | 11/2002 | Bright et al. | 60/527 |
| 2004/0112723 A1 * | 6/2004 | Jung et al. | 200/61.02 |
| 2007/0089515 A1 | 4/2007 | Shih et al. | |
| 2007/0169553 A1 | 7/2007 | Mutharasan et al. | |
| 2008/0144364 A1 | 6/2008 | Lee et al. | |

FOREIGN PATENT DOCUMENTS

WO  WO 2005024868 A2 *  3/2005
WO  WO 2007084070 A1 *  7/2007

OTHER PUBLICATIONS

Stuchlik et al. "All-optical actuation of amorphous chalcogenide-coated cantilevers", Journal of Non-Crystalline Solids, 353 (2007), pp. 250-262.
M. Stuchlik et al., "All-optical actuation of amorphous chalcogenide-coated cantilevers", Journal of Non-Crystalline Solids 353, 2007, pp. 250-262.

* cited by examiner

*Primary Examiner*—Anatoly Vortman
(74) *Attorney, Agent, or Firm*—Yee & Associates, P.C.; Jesse Abzug

(57) ABSTRACT

An actuator is provided. The actuator comprises a base portion, a cantilever beam connected to the base portion, and an actuator cell adjacent to the cantilever beam. The actuator cell comprises a first metal electrode positioned on the cantilevered beam, a second metal electrode positioned near the first metal electrode, and phase change material between the first and second metal electrodes, wherein the phase change material connects the first metal electrode to the second metal electrode, wherein applying a burst of energy to the phase change material causes the phase change material to change between an amorphous state and a crystalline state, causing the cantilevered beam to move between a first position and a target position, wherein the cantilevered beam remains at the target position upon removal of the energy.

1 Claim, 3 Drawing Sheets

PHASE CHANGE ACTUATOR

BACKGROUND OF THE INVENTION

1. Field of the Invention

The present invention relates generally to actuators and more specifically to actuating actuators using phase change material.

2. Description of the Related Art

Micro electromechanical systems (MEMS) based switches potentially have a very low resistance, a large on/off resistance ratio, and relatively small form factors, making them good candidates for radio frequency switching applications, such as switching antennas in a mobile phone for operation in a different frequency band, or for power management applications in multi-core microprocessors, such as switching unused cores off. The basic principle of a MEMS switch is analogous to a macroscopic relay, i.e. a spring loaded switch, typically a cantilever beam, is actuated up or down to open or close a metallic contact. In order to make a good contact, relatively large actuation forces are needed. To date, most MEMS switches use either piezo-electric or electrostatic forces to actuate the cantilever beam and thus open or close the switch. One problem of these techniques is that power is required to maintain the switch in one of the two states: either open or closed, depending on the design of the switch.

BRIEF SUMMARY OF THE INVENTION

According to one embodiment of the present invention actuator comprises a base portion, a cantilever beam connected to the base portion, and an actuator cell adjacent to the cantilever beam. The actuator cell comprises a first metal electrode positioned on the cantilevered beam, a second metal electrode positioned near the first metal electrode, and phase change material between the first and second metal electrodes, wherein the phase change material connects the first metal electrode to the second metal electrode, wherein applying a burst of energy to the phase change material causes the phase change material to change between an amorphous state and a crystalline state, causing the cantilevered beam to move between a first position and a target position, wherein the cantilevered beam remains at the target position after the supply of energy is stopped..

DETAILED DESCRIPTION OF THE INVENTION

Figure 1:
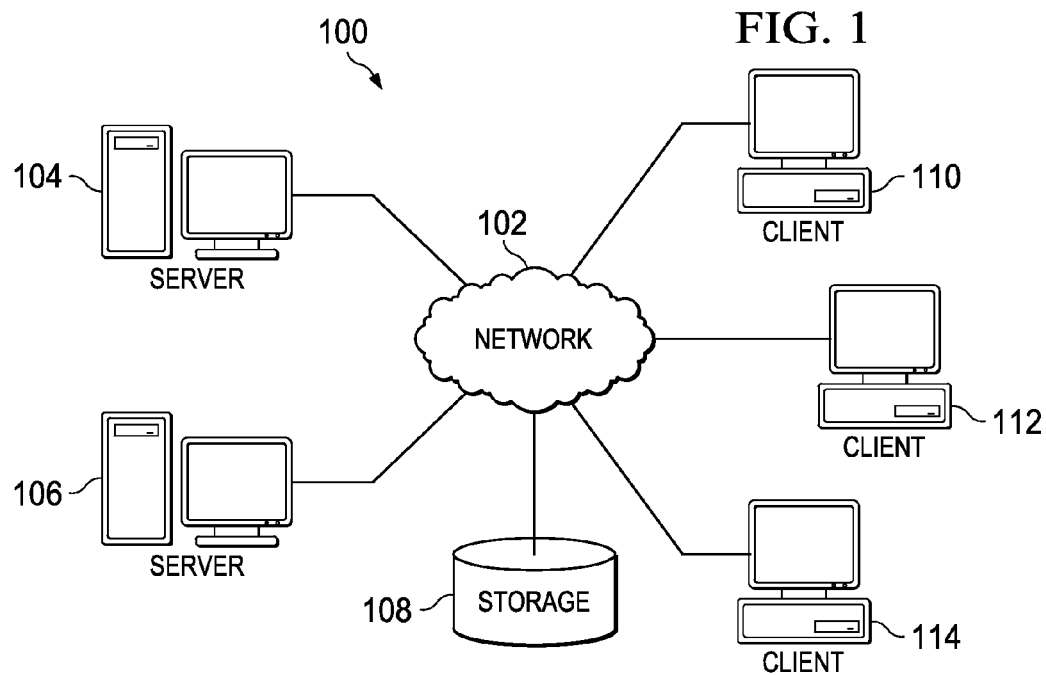
FIG. 1 is a pictorial representation of a network of data processing systems in which illustrative embodiments may be implemented.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including, but not limited to, wireless, wireline, optical fiber cable, RF, etc.

Computer program code for carrying out operations of the present invention may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 depicts a pictorial representation of a network of data processing systems in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational, and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

Figure 2:
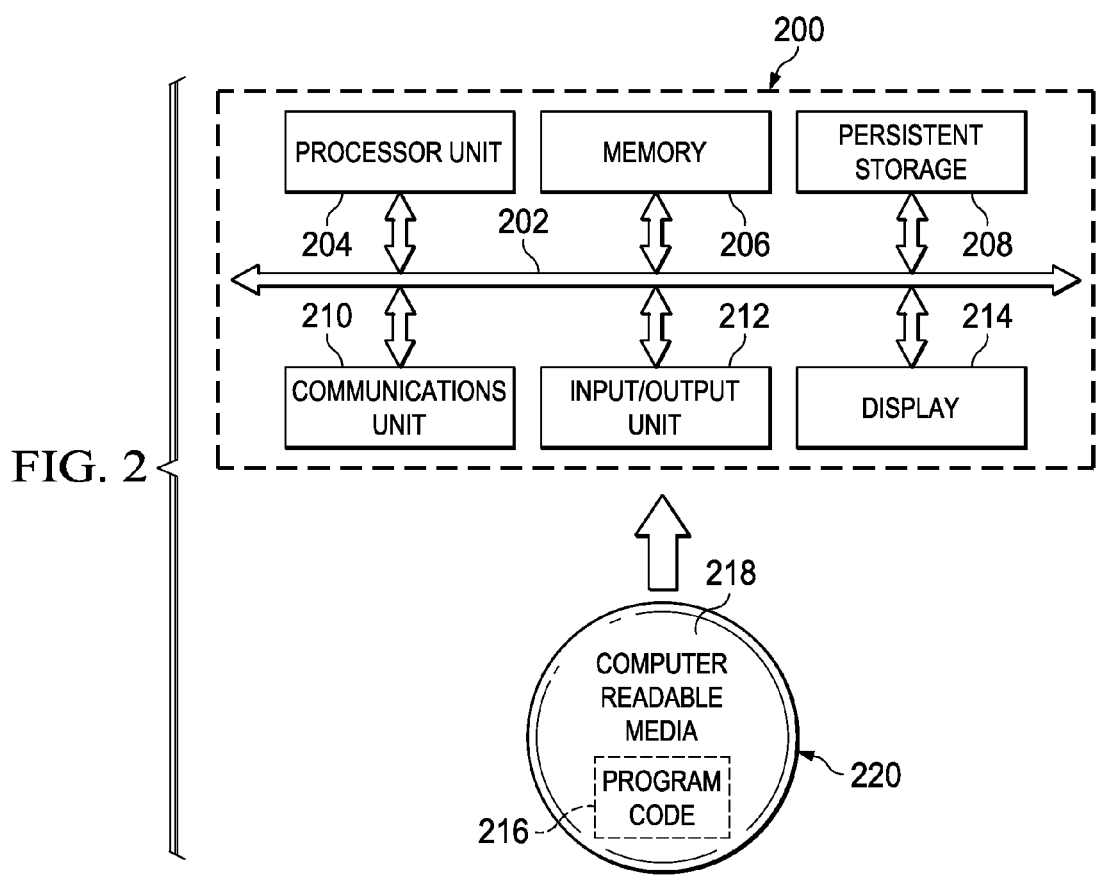
FIG. 2 is a block diagram of a data processing system in which illustrative embodiments may be implemented.

With reference now to FIG. 2, a block diagram of a data processing system is shown in which illustrative embodiments may be implemented. Data processing system 200 is an example of a computer, such as server 104 or client 110 in FIG. 1, in which computer-usable program code or instructions implementing the processes may be located for the illustrative embodiments. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer-implemented instructions, which may be located in a memory, such as memory 206. These instructions are referred to as program code, computer-usable program code, or computer-readable program code that may be read and executed by a processor in processor unit 204. The program code in the different embodiments may be embodied on different physical or tangible computer-readable media, such as memory 206 or persistent storage 208.

Program code 216 is located in a functional form on computer-readable media 218 that is selectively removable and may be loaded onto or transferred to data processing system 200 for execution by processor unit 204. Program code 216 and computer-readable media 218 form computer program product 220 in these examples. In one example, computer-readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer-readable media 218 also may take the form of a persistent storage, such as a hard drive, a thumb drive, or a flash memory that is connected to data processing system 200. The tangible form of computer-readable media 218 is also referred to as computer recordable storage media. In some instances, computer recordable media 218 may not be removable.

Alternatively, program code 216 may be transferred to data processing system 200 from computer-readable media 218 through a communications link to communications unit 210 and/or through a connection to input/output unit 212. The communications link and/or the connection may be physical or wireless in the illustrative examples. The computer-readable media also may take the form of non-tangible media, such as communications links or wireless transmissions containing the program code.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown.

As one example, a storage device in data processing system 200 is any hardware apparatus that may store data. Memory 206, persistent storage 208, and computer-readable media 218 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache such as found in an interface and memory controller hub that may be present in communications fabric 202.

Exemplary embodiments provide for an actuator comprising an actuator cell comprised of phase change material. Actuation is achieved using the different stress present in the two different phases of a phase change (PC) material such as GeSbTe alloys (e.g. $Ge_2Sb_2Te_5$, or $Ge_4Sb_1Te_5$), AgInSbTe alloys, or SbSe alloys. .

Phase change materials can be changed between an amorphous state and a crystalline state and exhibit different properties, such as electrical resistance or optical reflectivity, in each of the two states. Currently, phase change materials are used in data storage applications such as rewritable CD/DVD technology. Such phase change materials are also candidates for use in solid state memory devices.

Exemplary embodiments employ a burst of energy to cause the phase change material to change from one state to another state. In one exemplary embodiment a laser is used to heat the phase change material and cause the phase change material to change between the amorphous and crystalline states.

In an exemplary embodiment phase change material is deposited between two electrodes forming an actuator cell. The phase change material is heated by applying a burst of energy to the actuator cell, such as by passing a current between the two electrodes, through the phase change material. When the phase change material is heated to temperature above the melting point of the phase change material, the state, or phase, of the material can be controlled by controlling the rate of cooling of the phase change material. Fast cooling the phase change material results in the phase change material remaining in an amorphous state, whereas slower cooling the phase change material results in the phase change material switching to a crystalline state. The phase change material can be switched from the amorphous state to the crystalline state by heating the phase change material to above the crystallization temperature, which is below the melting temperature.

These two states of the phase change material have different electrical resistances, allowing the state of the actuator cell to be read out by measuring the electrical resistance of the actuator cell. Multiple bits of information may be stored in one actuator cell by controlling the amount of phase change material in each of the two states, resulting in intermediate values of electrical resistance and also intermediate positions of the cantilever beam.

In other words, the particular state of the phase change material, whether amorphous or crystalline, depends on the temperature reached in the phase change material during the application of the burst of energy and the rate of cooling of the phase change material. If the phase change material starts in the crystalline state, then the phase change material can be changed to an amorphous state by heating the phase change material to above the state transition temperature, or melting point. If the phase change material is then rapidly cooled, or quenched, then the phase change material remains in the amorphous state. However, if the material is cooled slowly, the phase change material will switch back to the crystalline state. Conversely, if the phase change material has been rapidly cooled to an amorphous state, the phase change material can be changed to the crystalline state by heating the phase change material to the recrystalization temperature, which is below the phase transition temperature. To achieve an intermediate state, that is a state wherein a portion of the phase change material is each of the crystalline and amorphous states, very short bursts of energy may be used so that only a fraction of the phase change material is converted from one state to another. Further, the beams remain in their position upon removal of the energy. That is, the energy is removed by no longer applying the energy. Thus, the beams maintain their position even after the energy is no longer being applied to the phase change material.

When the actuator cell structure used in exemplary embodiments changes between the amorphous and crystalline states, a change in the mechanical stress in the phase change material also occurs. Typically, crystallization results in an increase in density of the material and an increase in tensile stress, or a reduction in compressive stress, if the amorphous layer is initially in a compressive strain state. Such changes in stress can be used for mechanical actuation, by building the actuator cell on the base of a cantilever beam, as illustrated in FIGS. 3A and 3B below.

If the net stress in the phase change material and the two electrodes is tensile, then the end of the cantilever beam will bend up. If the net stress is compressive, the end of the beam will bend down. The initial net stress can be controlled through the choice of the electrode, phase change materials, the deposition technique, and their relative thicknesses. The stress in the actuator cell can then be changed by appropriate heating and cooling of the phase change material, resulting in a deflection of the cantilever. This deflection remains upon removal of the energy. The energy is removed by stopping the supply of the energy to the actuator cell. The phase change material can be switched back to the original state by appropriate heating and cooling of the phase change material to change the state of the material back to the original state. The deflection of the beam can be used for example to open or close an electrical contact, or for other MEMS actuation applications such as for positioning optical wave guides in an optical switching application, or activating control functions in drone vehicles, such as radio controlled vehicles, or in locking mechanisms. In radio controlled vehicles, power usage is always a concern, therefore being able to activate a servo in order to, for example, change a wing flap position for the duration of a turn and then applying a second small amount of energy to place the servo in the original or new position is much more energy efficient than continually applying energy to the servo in order to maintain a position, as in current technologies. Further, using a device in technologies such as locking mechanisms is beneficial as well. Once an electronic lock is in place, there would be no concern of a battery running out of power and unlocking the device, as the device would remain locked once the initial short burst of energy was applied and the actuator changed position.

Figure 3A:
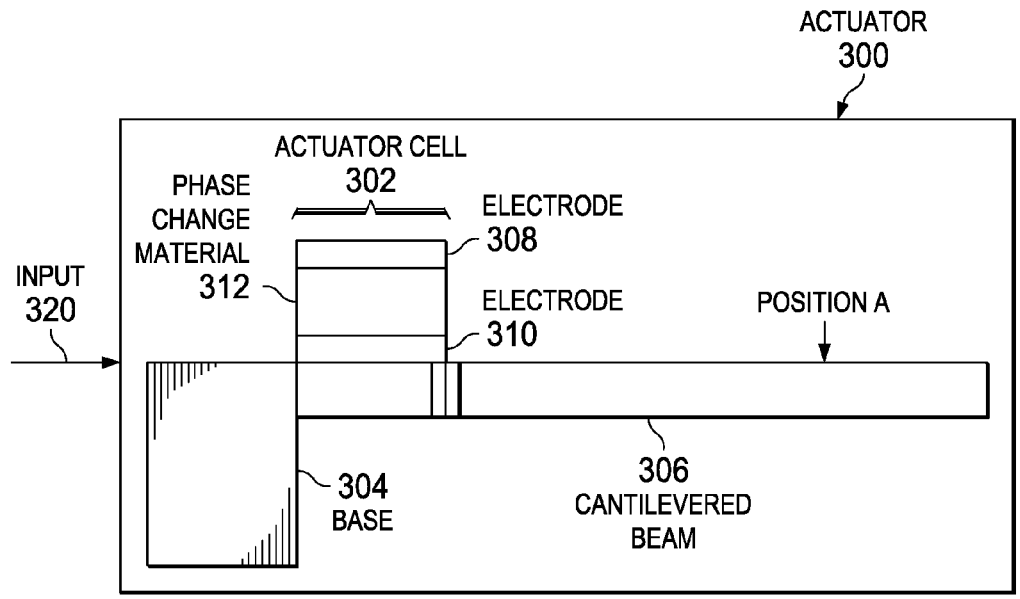
FIGS. 3A and 3B are a block diagram of an actuator in accordance with an exemplary embodiment.
Figure 3B:
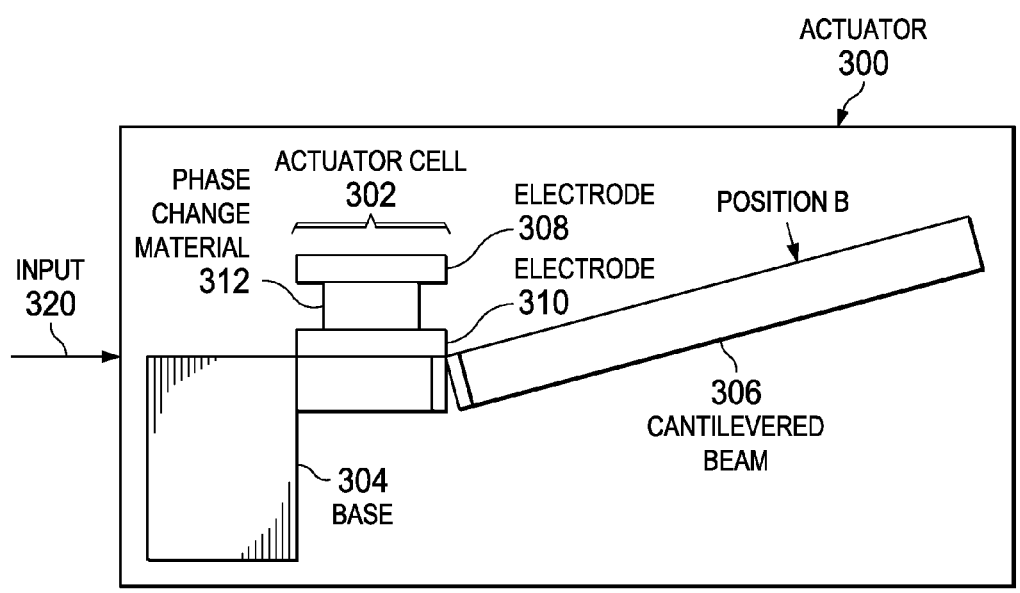

FIGS. 3A and 3B are a block diagram of an actuator in accordance with an exemplary embodiment. FIGS. 3A and 3B show actuator 300 in which a cantilevered beam 306 has moved between a first position, positions A, and a target position, position B. Actuator 300 is an actuator switch that may be used in many applications, such as an actuator in a switch in processor unit 204 in FIG. 2, or an actuator in a switch used to select different antennas in a mobile phone, or an actuator for positioning optical waveguides in an optical switch.

Actuator 300 comprises base 304, cantilevered beam 306 and actuator cell 302. Actuator 300 is connected to input 320. Actuator cell 302 comprises electrodes 308 and 310 and phase change material 312. In FIG. 3A, cantilevered beam 306 is in a first position, position A. When a voltage is applied to actuator 300 through input 320, current passes between electrodes 308 and 310 of actuator cell 302, heating phase change material 312. This causes phase change material 302 to change states, causing phase change material to either expand or contract, depending on the specific states that the phase change materials transitions between. This cause stress to be applied to cantilevered beam 306, changing the position of cantilevered beam 306.

FIG. 3B shows actuator 300 once a voltage has been applied to actuator 300 and phase change material 312 has changed state. In such a case, cantilevered beam 306 has changed position from the first position, position A to a target position, position B and actuator cell 302 has changed shape. That is, since phase change material 312 has changed state, the shape of actuator cell 302 changes as well, either expanding or contracting. It should be noted that while FIG. 3B shows actuator 302 as being smaller than in FIG. 3A, with electrode 308 closer to electrode 310 than in FIG. 3A and phase change material 312 occupying less space than in FIG. 3A, the change of state of phase change material 312 can also cause actuator cell 302 to expand in size. It should be understood that position B is only an example of a position that cantilevered beam 306 could be moved to. Cantilevered beam 306 can be moved to any position desired simply by calculating the amount of phase change material needed to be changed from one state to another in order to create the proper mechanical force to move the cantilevered beam to the target position. An appropriate burst of energy is applied to the phase change material, or several short burst of energy are applied to the phase change material if an intermediate transitional state is necessary to achieve the target potion. Furthermore, once the energy is removed, or no longer applied/supplied, that is, once voltage is no longer being received through input 320, cantilevered beam 306 remains in the position that it moved to. Thus, achieving great savings in terms of power usage and heat dissipation over the conventional forms of actuators which have to continually supply power to the actuator in order to keep the actuator in a particular position.

Furthermore, cantilevered beam 306 being able to be moved to any position allowed by the changing of state of phase change material 312 provides other benefits over other types of actuators. That is, there are no set positions wherein the cantilevered beam can only be at certain defined positions. Further, as needs change, simply applying different amounts energy to achieve different levels of state change within phase change material 312 allows actuator 300 to adapt to achieve new positions for usage of the actuator.

Although not shown, actuator cell 302 has an electrical connection to electrode 308 and/or 310 in order to supply electrical current (power) to phase change material 312, however, it is not necessary to have a mechanical contact between electrode 308 and cantilevered beam 306 or base 304. When phase change material 312 changes phase, it shrinks or expands in all three dimensions. This change in dimension in the in-plane directions gives rise to the actuation effect, i.e., when the phase change material shrinks, shrinkage in the normal direction will cause electrode 308 to move in the normal direction as electrode 308 is not constrained. However, the bottom surface of phase change material 312 is connected to electrode 310, which is connected to cantilevered beam 306, so when phase change material 312 contracts or expands in the in-plane direction, electrode 310 and cantilevered beam 306, resist this change of dimension. This shrinkage or expansion generates stress in electrode 310 and cantilevered beam 306 that cause cantilevered beam 306 to bend.

Figure 4:
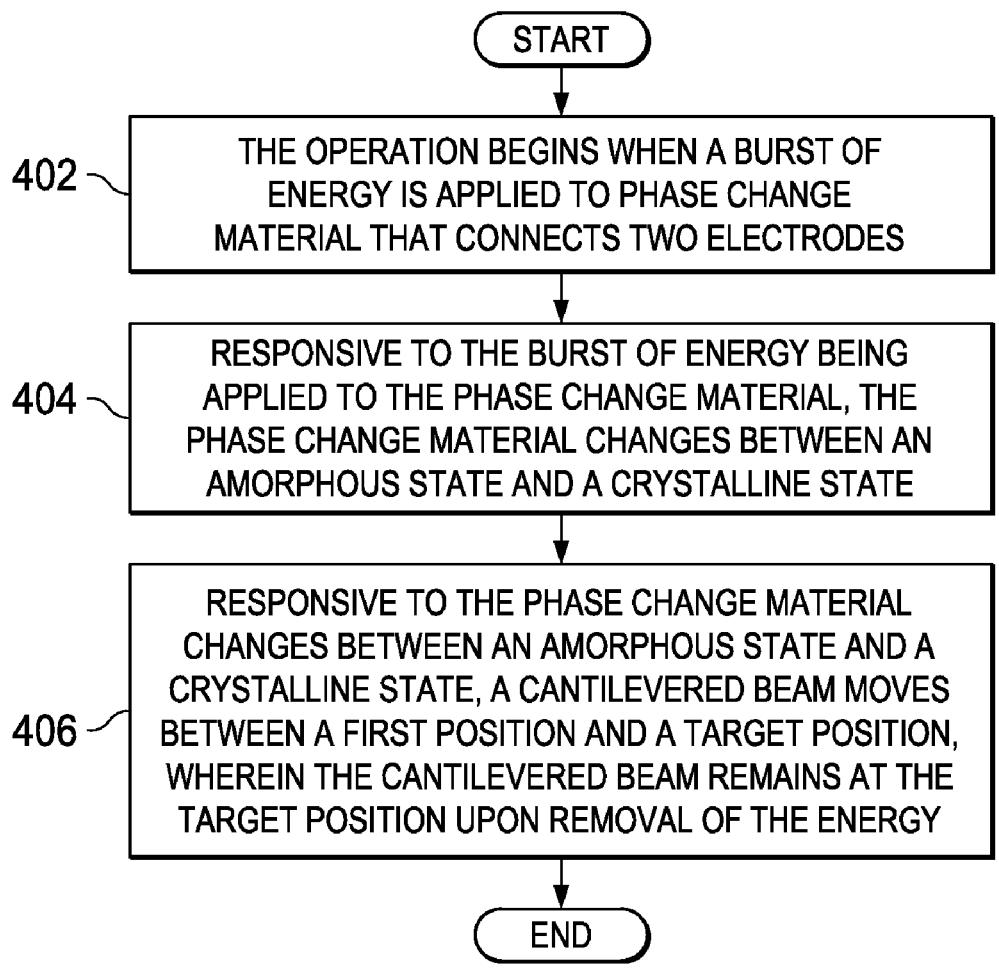
FIG. 4 is a flowchart illustrating the operation of activating an actuator in accordance with exemplary embodiment.

FIG. 4 is a flowchart illustrating the operation of activating an actuator in accordance with exemplary embodiment. The operation of FIG. 4 may be performed in an actuator such as actuator 300 of FIG. 3. The operation begins when a burst of energy is applied to phase change material that connects two electrodes (step 402). Responsive to the burst of energy being applied to the phase change material, the phase change material changes between an amorphous state and a crystalline state (step 404). Responsive the phase change material changes between an amorphous state and a crystalline state, a cantilevered beam moves between a first position and a target position, wherein the cantilevered beam remains at the target position upon removal of the energy (step 406) and the operation ends. Energy is removed by stopping the supply of the energy The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W), and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An actuator comprising:
   a base portion;
   a cantilever beam connected to the base portion; and
   an actuator cell adjacent to the cantilever beam, the actuator cell comprising:
      a first metal electrode positioned on the cantilevered beam;
      a second metal electrode positioned near the first metal electrode; and
      phase change material between the first and second metal electrodes, connecting the first and second metal electrodes, wherein applying a burst of energy to the phase change material causes the phase change material to change between an amorphous state and a crystalline state, causing the cantilevered beam to move between a first position and a target position, and wherein the cantilevered beam remains at the target position upon removal of the energy.

* * * * *